United States Patent
Ney

(10) Patent No.: US 8,644,055 B2
(45) Date of Patent: Feb. 4, 2014

(54) NONVOLATILE MEMORY WITH ENHANCED EFFICIENCY TO ADDRESS ASYMETRIC NVM CELLS

(75) Inventor: Alexandre Ney, Le Puy Ste Reparade (FR)

(73) Assignee: Infineon Technologies AG, Neubiberg (DE)

( * ) Notice: Subject to any disclaimer, the term of this patent is extended or adjusted under 35 U.S.C. 154(b) by 56 days.

(21) Appl. No.: 12/963,820

(22) Filed: Dec. 9, 2010

(65) Prior Publication Data
US 2012/0147663 A1   Jun. 14, 2012

(51) Int. Cl.
*G11C 11/00* (2006.01)
(52) U.S. Cl.
USPC .............. 365/158; 365/171; 365/173; 365/63
(58) Field of Classification Search
USPC ............ 365/158, 171, 173, 63; 257/421–422, 257/E29.323
See application file for complete search history.

(56) References Cited

U.S. PATENT DOCUMENTS

| | | |
|---|---|---|
| 6,930,914 B2 | 8/2005 | Perner |
| 7,148,550 B2 | 12/2006 | Kajiyama |
| 7,558,106 B2 * | 7/2009 | Hidaka ......................... 365/171 |
| 7,881,098 B2 * | 2/2011 | Xi et al. ....................... 365/158 |
| 2004/0160809 A1 | 8/2004 | Lin |
| 2006/0092696 A1 | 5/2006 | Bessho |
| 2010/0072566 A1 | 3/2010 | Kang |
| 2010/0091563 A1 | 4/2010 | Zheng |
| 2010/0110762 A1 | 5/2010 | Chen |
| 2010/0195376 A1 | 8/2010 | Yoon |
| 2010/0267171 A1 | 10/2010 | Sato |
| 2012/0105105 A1 * | 5/2012 | Shukh ............................ 326/62 |

FOREIGN PATENT DOCUMENTS

EP    1 332 498 B1    3/2007

OTHER PUBLICATIONS

Lee, et al., "Highly Scalable STT-MRAM with MTJs of Top-pinned Structure in 1T/1MTJ Cell", 2010 Symposium on VLSI Technology Digest of Technical Papers, Jun. 15-17, 2010, Honolulu, HI, USA, 2 pages.
Lin, et al., "45nm Low Power CMOS Logic Compatible Embedded STT MRAM Utilizing a Reverse-Connection 1T/1MTJ Cell," Electron Devices Meeting (IEDM), 2009 IEEE International, Dec. 7-9, 2009, Baltimore, MD, US, 4 pages.

* cited by examiner

*Primary Examiner* — David Lam
(74) *Attorney, Agent, or Firm* — SpryIP, LLC

(57) ABSTRACT

This application describes embodiments of MRAM cells that utilize a PMOS transistor as an access transistor. The MRAM cells are configured to mitigate the effects of applying asymmetric current loads to transition a Magnetic-Tunnel Junction of the MRAM cell between magnetoresistive states.

9 Claims, 5 Drawing Sheets

NONVOLATILE MEMORY WITH ENHANCED EFFICIENCY TO ADDRESS ASYMETRIC NVM CELLS

BACKGROUND

Nonvolatile memory (NVM) cells retain stored information without receiving a constant or persistent power supply. NVM cells can provide significant power savings for electronic systems that do not need or provide constant power to the cells. Also, the initialization time for electronic systems can be reduced via NVM. For example, instructions stored in an NVM cell are ready to execute and do not need to be recreated or reloaded during the initialization process.

NVM cells generally store information in a digital format. For example, NVM cells store information as zeros or ones. Hence, NVM cells generally toggle between a first state and a second state to reflect the digital format. The states may include an electrical charge state (e.g., Flash memory) or a magnetic state (e.g., Spin-Torque Transfer magnetoresistive random access memory (STT-RAM)).

Generally, an STT-MRAM cell includes a magnetic tunnel junction (MTJ) that acts a storage structure for a bit of information. The MTJ is toggled between different states using an NMOS transistor that provides a drive current to the MTJ that changes the spin of the electrons within a portion of the MTJ, such that the STT-MRAM cell can exist in at least two different magnetoresistive states for extended periods without a constant or persistent power supply. For example, the first state may be a zero state and the second state being a one state, such that each state may be read as a digital bit. The amount of drive current needed to transition the MTJ between the two states may be asymmetrical. In short, more drive current may be used to transition the MTJ from the first state to the second state, than the drive current used to transition the MTJ from the second state back to the first state.

In a NMOS transistor MRAM cell, the higher current state places the MTJ and the NMOS transistor in non-optimal operating conditions. For example, the higher current state can impact the reliability of the MTJ and it subjects the NMOS transistor to higher body effects. Hence, both components are operating at a less than optimal state or condition at the same time. Also, the higher current requirement dictates the size of the NMOS transistor and limits the scalability of the MRAM cell to smaller geometries.

SUMMARY

This Summary is provided to introduce the simplified concepts for devices and methods used to implement a Spin-Transfer Torque Magnetoresistive random access memory (STT-MRAM) cell. The devices and systems are described in greater detail below in the Detailed Description. This Summary is not intended to identify essential features of the claimed subject matter nor is it intended for use in determining the scope of the claimed subject matter.

STT-MRAM cells are a type of NVM that uses the magnetic properties of materials to toggle between different magnetoresistive states. STT-MRAMs comprise a magnetic tunnel junction coupled to or in electrical communication with an access transistor. The MTJ comprises magnetic materials that enable the MTJ to toggle between two different magnetoresistive states. The access transistor provides a drive current that enables the MTJ to toggle between the two states. Using a PMOS or p-type transistor as the access transistor reduces the amount of drive current asymmetry to transition between the two different magnetoresistive states.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

This disclosure relates to a STT-MRAM cell that incorporates a PMOS or p-type transistor as an access transistor to control the drive current provided to magnetic storage component or MTJ of the STT-MRAM cell. The MTJ toggles between two magnetoresistive states based on the drive currents provided by the PMOS transistor. In one instance, the MTJ requires a higher level of current to transition to a second state from a first state than the amount of current required to transition from the first state to the second state.

Under the higher current state or transition, the MTJ is operating at a less than optimal condition due to the higher level of current that can cause damage to the MTJ. However, the PMOS transistor at the higher current condition is minimally impacted by the body effect, which depends on the voltage difference between the transistor source and the substrate. Hence, the PMOS transistor is operating in an optimal state or condition during the higher current transition of the MTJ.

Under the lower current state or transition, the MTJ is operating at a more optimal condition to the lower level of current that can cause damage to the MTJ. But, in this instance, the body effect has a greater impact on the PMOS transistor than when it is operating under the higher current state. Hence, the PMOS transistor is operating at a less than optimal state or condition during the lower current transition of the MTJ.

In short, using a PMOS transistor as an access transistor in an MRAM cell, instead of an NMOS transistor, allows the MRAM cell to function in a more optimal manner by not enabling the components (MTJ & PMOS transistor) of the MRAM cell to operate at less than optimal conditions at the same time.

Example STT-MRAM Cell

Figure 1:
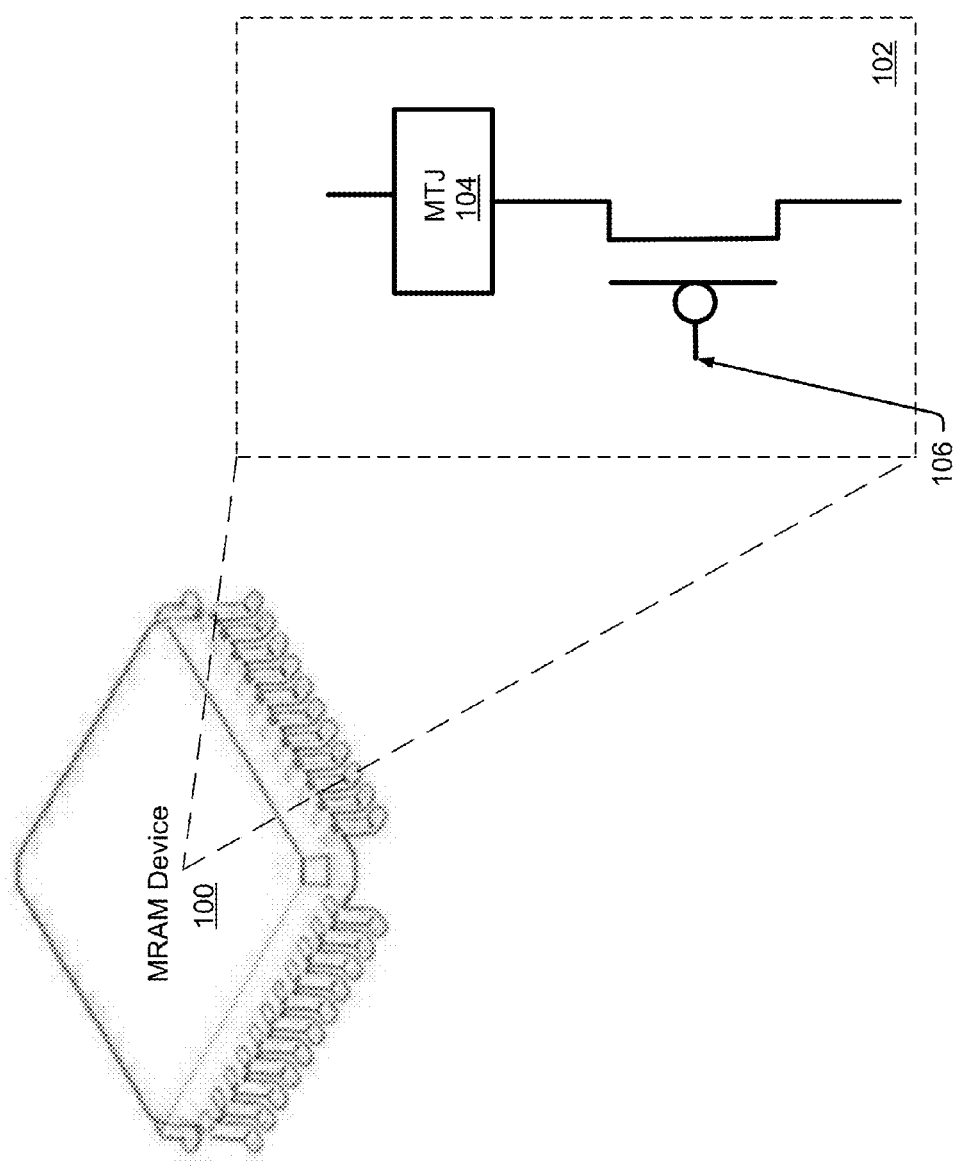
FIG. 1 is an illustration of an MRAM device and a schematic diagram representative of an MRAM cell according to one embodiment.

FIG. 1 is an illustration of a representative MRAM device 100 encapsulated in a package that may be incorporated into a printed circuit board (not shown) that may be incorporated into any electronic device that uses memory. MRAM cell 102 is a schematic representation of an individual cell of the MRAM device 100. The MRAM device 100 may include several million MRAM cells 102. In one embodiment, MRAM cell 102 includes a magnetic tunnel junction 104 that is coupled to or in electrical communication with a PMOS transistor 106. In this embodiment, the MTJ 104 is connected to the drain or source region of the PMOS transistor 106. The functionality of the MTJ 104 and the PMOS transistor 106 will be described below in greater detail.

Figure 2:
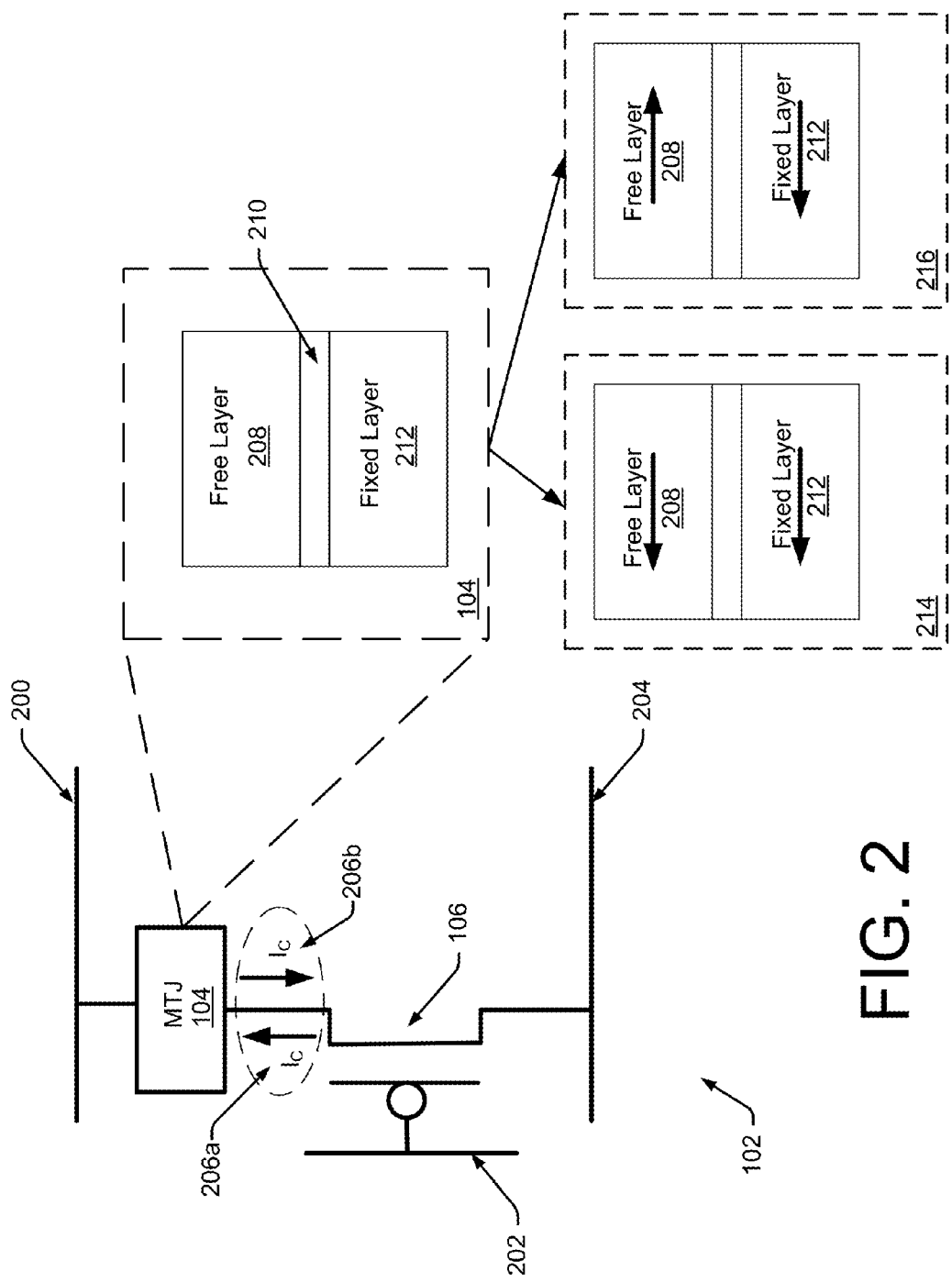
FIG. 2 is a schematic diagram representative of an MRAM cell according to one embodiment.

FIG. 2 is a schematic representation of MRAM cell 102 that incorporates a bit line 200, a word line 202, and a source line 204. Various voltages can be applied to the bit 200, word 202, and source 204 lines in order to direct a drive current 206a or 206b through the MTJ 104 and the PMOS transistor 106. As noted by the arrows, the drive current 206a or 206b can flow in either direction through the MTJ 104 and the PMOS transistor 106 to toggle the magnetoresistive state of the MTJ 104. The MTJ 104 may include several magnetic layers of material that enable the drive current 206a or 206b to alter the electron spin of at least one of the layers, such that the MTJ 104 may exist in at least two magnetoresistive states.

In one embodiment, the MTJ 104 may include a free layer 208, a tunnel layer 210, and a fixed layer 212. In this embodiment, the drive current 206a, under conditions to be described below, tunnels through the MTJ 104 and alters the spin of the electrons in the free layer 208 such that the resistance of the MTJ 104 can be altered and maintained without a persistent power supply. Similarly, a second drive current 206b that is of a different value than 206a can alter the spin of the electrons of the free layer to change the resistance of the MTJ 104. In this way the MTJ 104 can have two different resistances dependent upon the magnetization of the free layer 208.

In an illustrative embodiment, two states of the MTJ 104 may be the parallel magnetization state 214 of the free layer 208 and the fixed layer 212 and the anti-parallel magnetization 216 of the free layer 208 and the fixed layer 212. The parallel state 214 and the anti-parallel state 216 have distinguishable magnetoresistive characteristics, such that a reading current (not shown) applied to the MTJ 104 would be able to distinguish resistance differences between the two states. In this way, the MTJ 104 can be read as a zero or as a one for the purposes of storing an information bit digitally.

In the parallel state 214, the magnetization of the free layer 218 and the fixed layer 212 are similar or in parallel. In the embodiment shown in FIG. 2, the magnetization in the parallel state is shown by the arrows in the free layer 208 and the fixed layer 212 pointing in the same direction. Hence, in one embodiment, the parallel state could represent a digital one for a bit of information.

In the anti-parallel state 216, the magnetization of the free layer 218 and the fixed layer 212 are dissimilar, opposite, or anti-parallel. In the embodiment shown in FIG. 2, the spin of the electrons in the anti-parallel state is shown by the arrows in the free layer 208 and the fixed layer 212 pointing in the opposite directions. Hence, in one embodiment, the anti-parallel state could represent a digital zero for a bit of information.

The magnitude of the drive current 206a utilized or applied to transition the MTJ 104 from the anti-parallel (AP) state 216 to the parallel state (P) 214 is greater than the transitioning from P to AP based on common MTJ designs known in the art. Under high current conditions of the AP→P transition, the higher current may cause reliability problems with the MTJ 104 over time. Also, the higher current may negatively impact the threshold voltage of the access transistor 106, especially when the access transistor 106 is an n-type transistor.

For example, during the AP→P transition the MTJ 104 is at the less than optimal operating condition when using the higher drive current, but the PMOS access transistor 106 is at the optimal operating condition for minimizing the body effect or threshold voltage issues. In contrast, during the P→AP transition the MTJ 104 is at the optimal operating condition due to the lower drive current, but the PMOS transistor is at the less than optimal operating condition for managing body effect issues. Accordingly, less than optimal operating condition between the MTJ 104 and the access transistor 106 are diversified between the transition conditions. In short, this embodiment lowers the failure rate of MRAM cell 102 by not allowing less than optimal operating conditions for the MRAM cell components (MTJ 104 & transistor 106) to occur at the same time.

Figure 3:
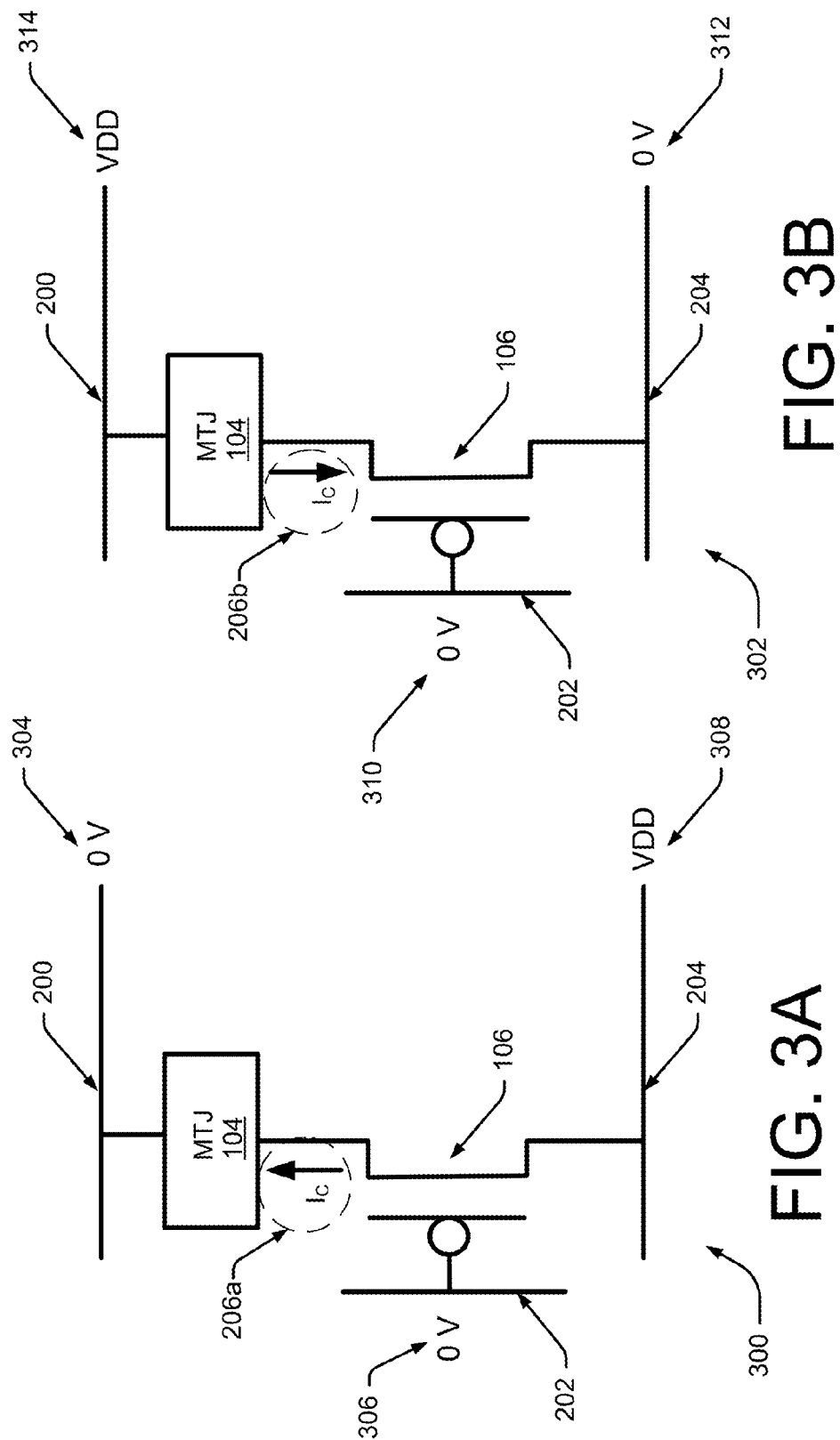
FIG. 3 is a schematic diagram representative of an MRAM cell being written to according to methods described herein.

Turning to FIGS. 3A and 3B, the write conditions enabled by the P→AP or AP→P transitions will be discussed. As discussed in FIG. 2, the drive current 206a or 206b enables the transition of the MTJ 104 between two magnetoresistive states or writes conditions. For example, the parallel condition 214 may represent a write "1" condition and the anti-parallel condition 216 may represent write "0" condition that enables the storage of digital information within an MRAM cell 102.

In FIG. 3A, the write "0" embodiment, illustrated by MRAM cell 300, is enabled by providing a zero or lower voltage signals 304 306 to the bit line 200 and the word line 202 while applying a higher voltage, such as VDD 308, to the source line 204 enables drive current 206a to alter the magnetization of the free layer to orient the MTJ 104 into a anti-parallel condition or the write "0" state.

In the write "1" embodiment, illustrated in FIG. 3B using MRAM cell 302, is enabled by providing a low or zero voltage signals 310, 312 to the word line 202 and the source line 204 while applying a higher voltage, such as VDD 314, to the bit line 200 enables drive current 206b to alter the magnetization of the free layer to orient the MTJ 104 into the parallel condition or the write "1" state.

In the embodiments above, the relative voltage values may be different in other embodiments but provide the same result of transitioning the MTJ 104 between magnetoresistive states. For example, as long as the absolute voltage values of VDD signals 314 and 308 are greater than the respective zero voltage signals 304, 306, or 310, 312 then the write conditions may still be achieved without the exact voltage values discussed above in regards to write "0" condition in MRAM cell 300 and write "1" condition in MRAM cell 302.

Example Access Transistors for STT-MRAM Cell

FIGS. 4A and 4B provide illustrative embodiments of the access transistor 106 implemented into a substrate that includes an MTJ 104. In one embodiment illustrated in FIG. 4A, MRAM cell 400 includes a PMOS transistor 106 coupled to a MTJ 104 represented by the free layer 208, barrier layer 210, and the fixed layer 212. A metal layer 402 couples the MTJ to the PMOS transistor 106. For purposes of ease of illustration, the metal layer 402 is shown as a single level metal, but in other embodiments, the levels of metal used to connect the transistor 106 to the MTJ 104 may be more numerous.

Figure 4:
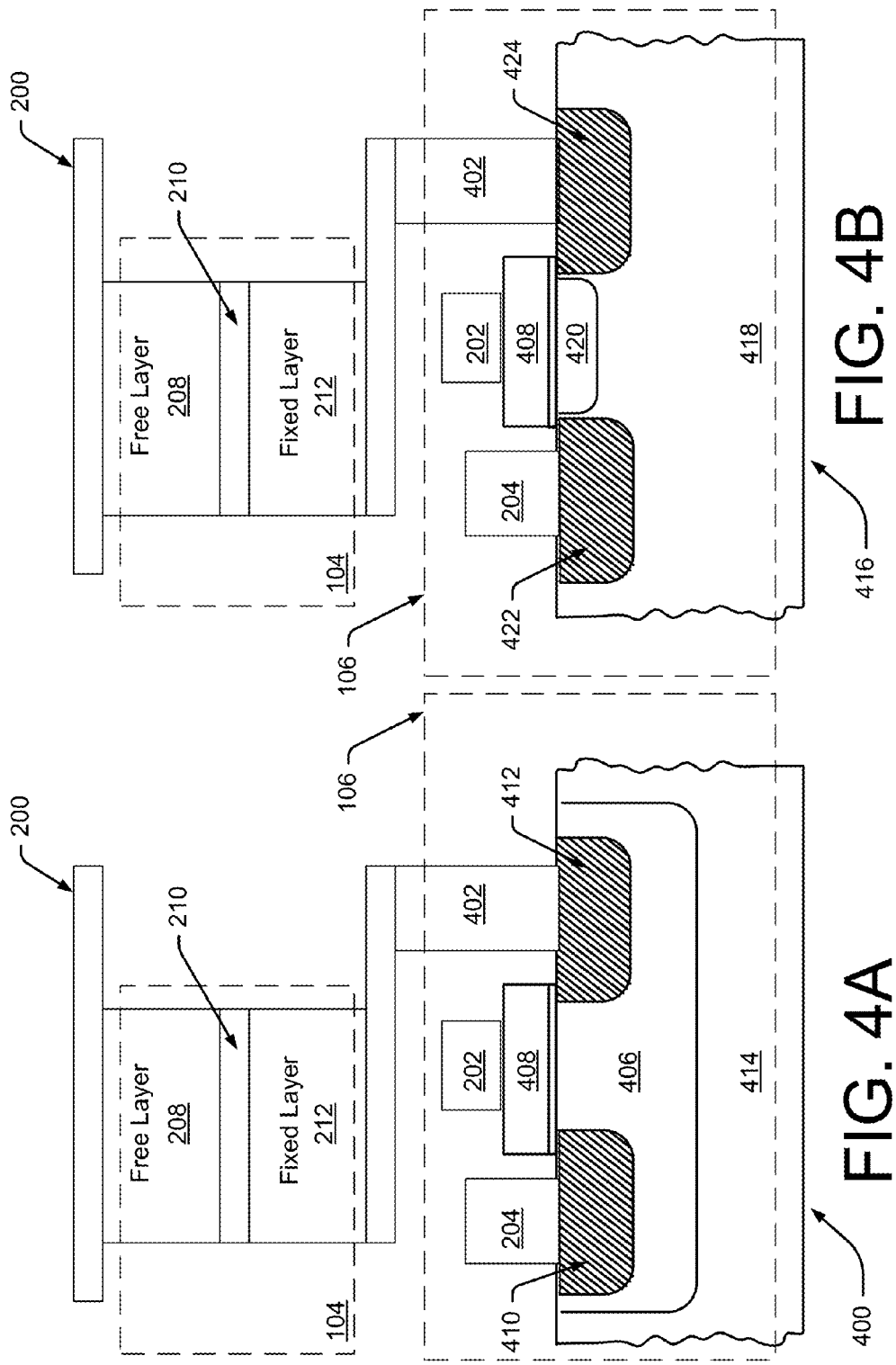
FIG. 4 is an illustration of representative MRAM cells incorporated into a substrate.

In the MRAM cell 400, the transistor gate 408 resides over p-type doped region 410 that forms the source region of the transistor 106. An n-type doped region 406 forms a well or substrate or bulk region of the transistor 106 and another p-type doped region 412 forms a drain region of the transistor 106. Also, the transistor 106, in this embodiment, is implemented in a p-type substrate 414. The bit line 200, the word line 202 and the source line 204 are shown in FIG. 4 as being coupled to the drain region, gate region, and source region respectively of the transistor 106.

In another embodiment illustrated in FIG. 4B, an MRAM cell 416 is implemented in an n-type substrate 418. The access transistor 106, in this embodiment, is still a PMOS transistor 106 that includes a p-type doped region 422, an n-type doped region 420, and another p-type doped region 424 that form the access transistor 106.

The two embodiments above are examples of PMOS transistors that may be implemented in a substrate and coupled to an MTJ. However, a person of ordinary skill in the art could implement several arrangements of dopants, materials, or substrates to form a PMOS transistor that can be coupled to an MTJ. The embodiments in FIGS. 4A and 4B are merely representative examples.

Example Methods for an STT-MRAM Cell

Figure 5:
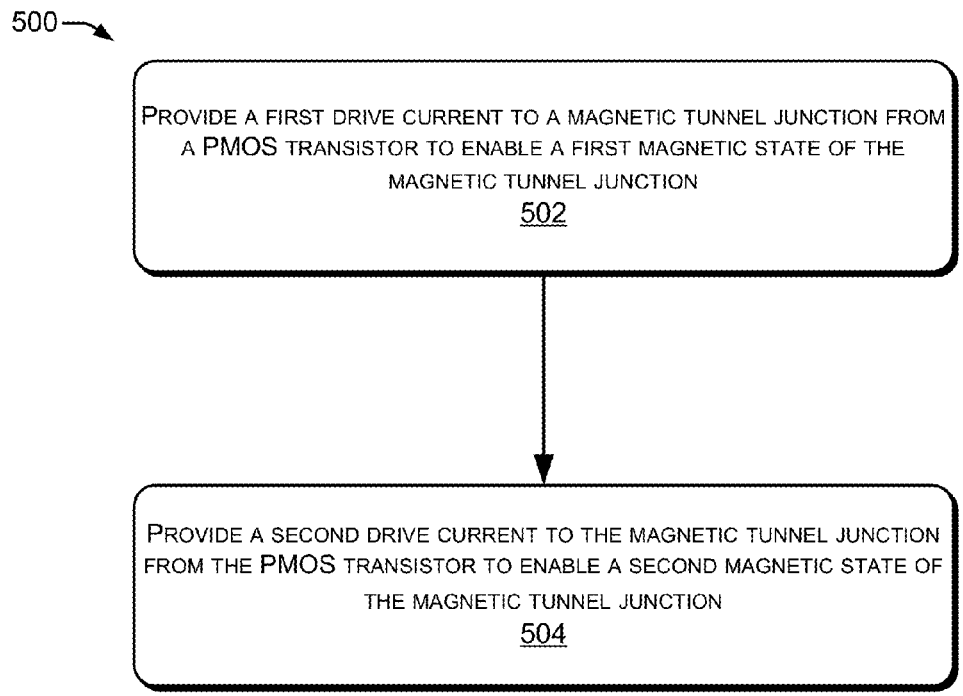
FIG. 5 is a flowchart of a method described herein.

FIG. 5 is a representation of a method 500 to write a "0" or "1" to an MRAM cell 102 that includes a PMOS transistor 106. At 502, the MRAM cell 102 receives a drive current 206a via PMOS transistor 106 to transition the magnetoresistive state of the MTJ 104 of MRAM cell 102. In one embodiment, a "0" is written to the MTJ 104 by applying a higher voltage to the source line 204 than the voltages that are applied to the bit line 200 and the word line 202 connected to transistor 106, as shown MRAM cell 300 in FIG. 3. In this embodiment, the write "0" state is represented by the parallel configuration 214 of MTJ 104, as shown in FIG. 2.

At 504, the MRAM cell 102 receives another drive current 206b via PMOS transistor 106 to transition the magnetoresistive state of the MTJ 104 of MRAM cell 102. In this embodiment, a "1" is written to the MTJ 104 by applying a higher voltage to the bit line 200 than the voltages that are applied to the word line 202 and the source line 204 connected to transistor 106, as shown in MRAM cell 302 in FIG. 3. In this embodiment, the write "1" state is represented by the anti-parallel configuration 216 of MTJ 104, as shown in FIG. 2.

CONCLUSION

Although the embodiments have been described in language specific to structural features and/or methodological acts, is the claims are not necessarily limited to the specific features or acts described. Rather, the specific features and acts are disclosed as illustrative forms of implementing the subject matter described in the disclosure.

What is claimed is:

1. A magnetoresistive random-access memory (MRAM) cell comprising:
    a first doped region comprising a majority of p-type dopants, the first doped region being in electrical communication with a metal source line configured to conduct a source line voltage;
    a second doped region in the MRAM cell comprising a majority of n-type dopants, the second doped region being in electrical communication with a metal word line configured to conduct a word line voltage;
    a third doped region in the MRAM cell comprising a majority of p-type dopants, the second doped region being disposed between the first doped region and the third doped region; and
    a magnetic tunneling junction in electrical communication with the third doped region and a metal bit line configured to conduct a bit line voltage, the magnetic tunneling junction comprising:
        a first magnetic layer comprising a first magnetoresistive state and a second magnetoresistive state;
        a second magnetic layer being below the first magnetic layer and comprising a fixed magnetic state; and
        a tunneling barrier layer disposed between the first magnetic layer and the second magnetic layer;
    wherein the bit line voltage, the word line voltage, and the source line voltage are provided in a combination that enables a drive current to be provided to the magnetic tunneling junction to enable the first magnetic state of the magnetic tunneling junction.

2. The MRAM cell of claim 1, wherein the source line voltage has an absolute value that is greater than an absolute value of the bit line voltage and is greater than an absolute value of the word line voltage.

3. The MRAM cell of claim 1, further comprising a bulk doped region comprising a majority of p-type dopants such that the number of p-type dopants exceeds a number of n-type dopants.

4. The MRAM cell of claim 1, further comprising a bulk doped region comprising a majority of n-type dopants.

5. A substrate comprising:
    a first doped region comprising a majority of p-type dopants, the first doped region being in electrical communication with a metal source line configured to conduct a source line voltage;
    a second doped region in the substrate comprising a majority of n-type dopants, the second doped region being in electrical communication with a metal word line configured to conduct a word line voltage;
    a third doped region in the substrate comprising a majority of p-type dopants, the second doped region being disposed between the first doped region and the third doped region; and
    a magnetic tunneling junction in electrical communication with the third doped region and a metal bit line configured to conduct a bit line voltage, the magnetic tunneling junction comprising:
        a first magnetic layer comprising a first magnetoresistive state and a second magnetoresistive state;
        a second magnetic layer being below the first magnetic layer and comprising a fixed magnetic state; and
        a tunneling barrier layer disposed between the first magnetic layer and the second magnetic layer;
    wherein the bit line voltage, the word line voltage, and the source line voltage are provided in a combination that enables a drive current to be provided to the magnetic tunneling junction to enable the second magnetic state of the magnetic tunneling junction.

6. The substrate of claim 5, wherein the bit line voltage has an absolute value that is greater than an absolute value of the source line voltage and is greater than an absolute value of the word line voltage.

7. The substrate of claim 5, further comprising a bulk doped region comprising a majority of p-type dopants such that the number of p-type dopants exceeds a number of n-type dopants.

8. The substrate of claim 5, further comprising a bulk doped region comprising a majority of n-type dopants.

9. A substrate comprising:
    a first doped region comprising a majority of p-type dopants;
    a second doped region in the substrate comprising a majority of n-type dopants;
    a third doped region in the substrate comprising a majority of p-type dopants, the second doped region being disposed between the first doped region and the third doped region; and
    a magnetic tunneling junction (MTJ) in electrical communication with the third doped region, wherein a first voltage combination at the first doped region, the second doped region, and the third doped region enables a drive current through the MTJ enabling a first magnetic state in the MTJ, and wherein a second voltage combination at the first doped region, the second doped region, and the third doped region enables a drive current through the MTJ enabling a second magnetic state in the MTJ.

* * * * *